United States Patent
Takano et al.

(10) Patent No.: US 9,651,596 B2
(45) Date of Patent: May 16, 2017

(54) SYSTEM AND APPARATUS FOR MEASURING CAPACITANCE

(71) Applicant: Keysight Technologies, Inc., Minneapolis, MN (US)

(72) Inventors: Kenichi Takano, Loveland, CO (US); Hiroshi Nada, Loveland, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 526 days.

(21) Appl. No.: 14/015,907

(22) Filed: Aug. 30, 2013

(65) Prior Publication Data

US 2015/0061720 A1    Mar. 5, 2015

(51) Int. Cl.
*G01R 31/02* (2006.01)
*G01R 31/26* (2014.01)
(Continued)

(52) U.S. Cl.
CPC ......... *G01R 27/2605* (2013.01); *G01R 31/26* (2013.01); *G01R 31/2601* (2013.01);
(Continued)

(58) Field of Classification Search
CPC  G01R 31/2601; G01R 31/26; G01R 31/2607; G01R 31/2884; G01R 31/2621;
(Continued)

(56) References Cited

U.S. PATENT DOCUMENTS

| | | | |
|---|---|---|---|
| 2002/0036515 A1* | 3/2002 | Eldridge | G01R 31/31721 324/762.03 |
| 2002/0125904 A1* | 9/2002 | Eldridge | G01R 31/31721 324/754.03 |

(Continued)

FOREIGN PATENT DOCUMENTS

JP    2008070307 A    3/2008

OTHER PUBLICATIONS

Miyake, et al.; Correlation between Direct Charge Measurement (DCM) and LCR Meter on Deep Submicron CMOS Test Structure Capacitance Measurement; Proceedings IEEE ICMTS; 2010; pp. 158-162.

(Continued)

*Primary Examiner* — Huy Q Phan
*Assistant Examiner* — Raul Rios Russo

(57) ABSTRACT

Systems and methods for determining a capacitance on a device-under-test ("DUT"). An example implementation includes a voltage signal generator that generates a voltage signal alternating between a high voltage and a low voltage at regular time intervals. The voltage signal generator causes a DUT current to flow in the DUT. The DUT current comprises a leakage current and a capacitance measurement current in response to the voltage signal. A current signal generator receives the DUT current from the DUT. The current signal generator generates a cancellation current signal alternating between high and low values at the regular time intervals of the voltage signal such that the cancellation current signal cancels the leakage current through the DUT. A signal measurement circuit receives the capacitance measurement current remaining after the leakage current is canceled to generate an output voltage having an output voltage value used to determine a capacitance of the DUT.

5 Claims, 5 Drawing Sheets

(51) Int. Cl.
*G01R 27/26* (2006.01)
*G01R 31/28* (2006.01)

(52) U.S. Cl.
CPC ..... *G01R 31/2642* (2013.01); *G01R 31/2648* (2013.01); *G01R 31/2831* (2013.01)

(58) Field of Classification Search
CPC ............ G01R 31/2642; G01R 31/2648; G01R 31/2831; G01R 31/31702; G01R 31/002; G01R 31/327; G01R 31/333; G01N 27/42; G01N 31/02; H01H 1/0015
USPC ......... 324/71, 378, 403, 415, 425, 500, 537, 324/762.01
See application file for complete search history.

(56) References Cited

U.S. PATENT DOCUMENTS

| | | | | |
|---|---|---|---|---|
| 2002/0186037 | A1* | 12/2002 | Eldridge | G01R 31/31721 324/754.07 |
| 2003/0085729 | A1* | 5/2003 | Binkley | G01R 31/3004 324/762.01 |
| 2004/0263198 | A1* | 12/2004 | Binkley | G01R 31/3004 324/762.01 |
| 2005/0156619 | A1* | 7/2005 | Manhaeve | G01R 31/3173 324/762.01 |
| 2005/0237079 | A1* | 10/2005 | Tanida | G01R 31/2844 324/762.01 |
| 2006/0267599 | A1* | 11/2006 | Pooranakaran | G01R 27/2605 324/681 |
| 2012/0265196 | A1* | 10/2012 | Turner | A61B 17/32009 606/34 |
| 2014/0009177 | A1* | 1/2014 | Ashton | G01R 27/2605 324/681 |

OTHER PUBLICATIONS

Agilent Technologies, Inc.; HP 4284A Precision LCR Mater Operation Manual; p. 9-9.

Song, et al.; Leakage compensated charge method for determining static C-V characteristics of ultra-thin MOS capacitors; AIP Conf. Proc. 449; pp. 231-234; 1998.

Schmitz, et al.; Test Structure Design Considerations for RF-CV Measurements on Leaky Dielectrics; IEEE Tans. Semiconductor Manufacturing; vol. 17, No. 2; May 2004; pp. 150-154.

* cited by examiner

SYSTEM AND APPARATUS FOR MEASURING CAPACITANCE

TECHNICAL FIELD

The present invention relates generally to systems and methods for testing electronic devices, and more particularly to systems and methods for measuring capacitance.

BACKGROUND

There is an increasing demand for semiconductor test systems that perform capacitance measurement on a large scale (in terms of volume), and at a high speed. Semiconductor manufacturing processes are implementing semiconductor process dispersion control and new process designs. Test systems capable of large scale and high volume capacitance testing are needed in order to meet the demands of such the newest semiconductor processes. On the other hand, finer design rules for the physical design of the semiconductor devices are resulting in ever thinner MOSFET gate dielectric films. A thinner gate dielectric increases the likelihood of a tunnel effect that generates a leakage current. Leakage currents create problems such as, a reduction of measurement dynamic range and an increase in measurement costs. The problems created by leakage currents complicate industry-wide efforts to meet the demands of large scale and high volume capacitance testing.

Various techniques are utilized for minimizing the effect of leakage currents on test measurements. A typical capacitance measurement test system may measure capacitance on a device-under-test ("DUT") by probing the DUT and treating the circuitry between the probes as an equivalent circuit having capacitance, $C_p$, in parallel with resistance, $R_p$, or $C_p//R_p$. The $C_p$-$R_p$ measurement mode is amenable to measurement with an LCR meter using the auto balancing bridge method.

In the LCR meter with auto-balancing bridge method, a voltage oscillator output is applied to the DUT causing a current in the in the DUT with an impedance, $Z_x = C_p//R_p$. The current then flows into a feedback resistor of a current-to-voltage ("I-V") converter. The I-V converter operates so that the current in the feedback resistor and the current in the DUT are at the same level. When the levels are the same, the voltage potential at a node between the DUT and the I-V converter is at zero (0) volts. In this state, the $Z_x$ value may be determined by comparing the voltage applied to the DUT and the output voltage of the I-V converter. When the voltage at the node between the DUT and I-V converter is not zero, the I/V converter detects an error current and its output is divided into a component of 0 degree and a component of 90 degree by a phase detector. The output signal of the phase detector is a DC level corresponding to the magnitude of the non-balanced component by the loop filter. The DC level signal is sent to a vector modulator to modulate each of the 0 degree component signal and the 90 degree component signal, respectively. Reverse amplification of the output signal of the vector modulator is performed. The signal passes through the feedback resistor and returns to the node between the DUT and I-V converter. The signal is designed to negate or cancel the leakage current flowing in the DUT.

One problem with the LCR with auto-balancing bridge method is that the measurement range for the resistance is determined by the smaller one of the two impedances of $C_p$ and $R_p$. Therefore, the measurement error for either $C_p$ or $R_p$ increases as the ratio of $C_p$ and $R_p$ increases. Typically, for DUTs having a large leakage current, the impedance $R_p$ is frequently lower than the impedance $C_p$ resulting in an increase in the measurement errors of $C_p$. Another problem is that the LCR meter measurement time for 1 device is several tens of milliseconds making this technique largely unsuitable for use in high volume testing.

Another method for cancelling leakage current is the quasi-static C-V ("QSCV") method. In the QSCV method, a voltage varying in time is applied to the DUT capacitance. The voltage varies at a certain rate for a predefined time. The DUT capacitance is determined by measuring the produced DC current. A method to cancel leakage current uses an independent DC source to address the problem relating to limitations in the measurement range due to the leakage current.

However, the QSCV method has problems as well. For example, high precision current sources are needed to reduce the measurement error. In an example implementation, a capacitor to be measured may have a capacitance of 10 pF and a leakage current resistance of 1 kΩ, and the measurement may be performed using a 1V/20 ms ramp wave using a measurement current of 500 pA. In order to keep the measurement error under 1%, the precision current source must generate current at an error rate of 0.0000005% or smaller in order to cancel a leakage current of 1 mA. Therefore, this method is unsuitable for capacitance measurement for an advanced process where leakage current is large. It also takes 20 ms or more to measure one device making this method largely unsuitable for high volume testing.

Another method used for cancelling leakage current the Direct Charge Measurement (DCM) method, which uses a step voltage generator and an integrator with a reset switch. The step voltage generator applies a voltage $V_{step}$ to the DUT. The integrator integrates a signal representing an electric charge generated by the DUT. If the $R_p$ is large enough, the capacitance, $C_p$, of the DUT can be expressed by the output of the integrator, $V_{out}$, and the capacitance of integrator capacitor, $C_{range}$, as follows:

$$C_p = -(V_{out}/V_{step})*C_{range}.$$

The reset switch is triggered 'ON' at the conclusion of the measurement. The electric charge of the integrator capacitor, $C_{range}$, is discharged. The minimum measurement time of an integrator is typically determined by the response time of the integrator, which is typically on the order of several microseconds. Therefore, the DCM method is capable of performing high speed capacitance measurements making it possible to measure a large number of capacitances in a short time, which improves measurement speed over the LCR meter method by several orders of magnitude.

If the resistance, $R_p$, has a finite value, the charge due to leakage current and the charge due to the capacitance, $C_p$, being measured are integrated at the same time. Each charge can be distinguished by measuring the variation of the voltage output during the integration. However, the leakage current decreases the resolution of the measurement of the capacitance, $C_p$, thereby increasing the measurement error. In an example implementation, a capacitor to be measured may have a capacitance of 10 pF and a leakage current resistance of 1 kΩ. The integration time, $t_{int}$, of the integrator may be 1 μsec, and $V_{step}$ may be set to vary from 0 V. to 1V. The integrator integrates the charge as follows:

$$Q = I_{DUT}*t_{int} + C_p V_{step} = 1 \text{ nC} + 10 \text{ pC} = 1.01 \text{ nC}$$

Assuming a measurement is taken using a voltage supply with 0.01% resolution, the resolution of the capacitance measurement is about 0.1 pC, which is 1% of the measured capacitance value. The resolution of the capacitance measurement is about 100× the measurement resolution of the output voltage, $V_{out}$, which would mean there would be a 100× increase in the measurement error.

In view of the foregoing, there is an ongoing need for improved systems and methods for measuring capacitance in high volume and large scale processes with low measurement error at high leakage currents.

SUMMARY

In view of the above, a system is provided for measuring capacitance that addresses the needs described above. In an example implementation, a circuit for determining capacitance includes a voltage signal generator that generates a voltage signal alternating between a high voltage and a low voltage at regular time intervals. The voltage signal generator causes a DUT current to flow in the DUT. The DUT current comprises a leakage current and a capacitance measurement current in response to the voltage signal. A current signal generator receives the DUT current from the DUT. The current signal generator generates a cancellation current signal alternating between high and low values at the regular time intervals of the voltage signal such that the cancellation current signal cancels the leakage current through the DUT. A signal measurement circuit receives the capacitance measurement current remaining after the leakage current is canceled to generate an output voltage having an output voltage value used to determine a capacitance of the DUT.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

As used herein, the term "Device-Under-Test" or "DUT" shall refer to any electronic device through which a capacitance may be measured, which includes any semiconductor device comprising two or more test points at which capacitance measurements may be performed. A measurement of a "capacitance" shall be understood to mean the capacitance measured between any two test points and is not limited to measurement of any particular element (i.e. capacitor, transistor gate, etc.).

I. Introduction

Figure 1:
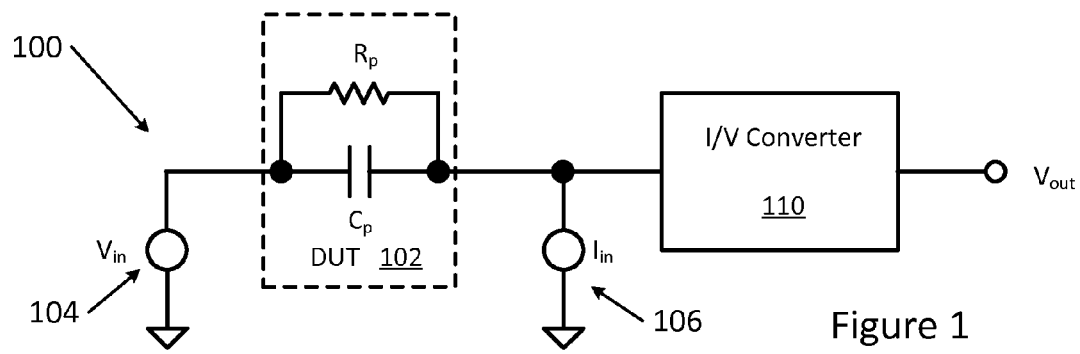
FIG. 1 is a schematic diagram of an example circuit for measuring capacitance in a device-under-test ("DUT").

FIG. 1 is a schematic diagram of an example circuit for measuring capacitance 100 in a device-under-test ("DUT") 102. The circuit for measuring capacitance 100 comprises a voltage signal generator 104 configured to generate a voltage signal alternating between a high voltage and a low voltage at regular time intervals. The voltage signal generator 104 is connected to apply the voltage signal directly to the DUT as shown in FIG. 1. However, in other example implementations, the voltage signal generator 104 may be connected to apply the voltage at any node of the circuit 100 that generates a desired signal across the DUT 102.

The circuit 100 includes connections to the DUT 102, which may typically be provided in a test bed and accessed via test probes. It is noted that the specific connections to be made to the DUT 102 may be made with any suitable known system for accessing the DUT 102 in a test system. The use of connectors and test points in testing components is well known in the art and will not require detailed discussion.

As shown in FIG. 1, the circuit 100 is configured to obtain a capacitance measurement across a portion of the DUT 102 between the first and second test points (represented by the nodes connecting the DUT 102). The portion of the DUT 102 being measured is represented schematically in FIG. 1 as having a capacitance, $C_p$, and a resistance, $R_p$, representing a leakage current path. The capacitance, $C_p$, is the capacitance that is being measured by the circuit 100. The capacitance, $C_p$, and a resistance, $R_p$, are indicated as connected in parallel to form an impedance $Z_x = C_p//R_p$. The first and second DUT connectors are configured to provide a path for a DUT current comprising a leakage current and a capacitance measurement current due to charge from the capacitor. The leakage current alternates between a high leakage current and a low leakage current in response to the alternating high voltage and low voltage of the voltage signal. The leakage current may also comprise a bias DC current in response to a bias voltage, $V_{bias}$, that may be added to the voltage signal.

The current signal generator 106 in FIG. 1 is connected to the DUT 102 at the second DUT connector. The current signal generator 106 is configured to generate a cancellation current signal alternating between high and low values at the same regular time intervals of the voltage signal. The current signal generator 106 is configured to generate the cancellation current signal in such a manner that the cancellation current signal cancels the leakage current through the DUT 102.

The circuit 100 includes a signal measurement circuit 110 configured to receive the capacitance measurement current remaining after the leakage current is canceled. The signal measurement circuit 110 generates an output voltage having an output voltage value that is used to determine the capacitance, $C_p$. For example, the output voltage value may be indicative of a capacitance measurement current level or charge. As described below, the output voltage value may represent a current value, or a value indicative of a charge received from the capacitance, $C_p$.

The circuit 100 in FIG. 1 provides a system and methods for measuring the capacitance of the DUT 102 with cancellation of leakage current by the use of the current signal generator 104. The current signal generator 106 performs leakage current cancellation by generating a cancellation current signal having substantially the same peak-to-peak and timing characteristics of the leakage current in response to the voltage signal. In example implementations, the current signal generator 106 may be independently controlled to generate the cancellation current signal with the correct peak-to-peak and timing characteristics.

In some example implementations, the voltage signal generator 104 may generate a voltage signal as a series of steps having a high voltage for a predetermined time period and a low voltage for a predetermined time period. The bias voltage, $V_{bias}$, may be added to the voltage output of a step voltage generator to keep both the high value and the low value above zero volts. Example implementations of the circuit 100 in which the voltage signal generator 104 generates a step voltage, Vstep, are described below with reference to FIGS. 2A-5.

In some example implementations, the voltage signal generator 104 may generate a voltage signal as an oscillating wave rising to a high value for a half cycle and back down to a low value for another half cycle. The bias voltage, $V_{bias}$, may be added to the oscillating voltage output of an oscillating voltage generator to keep both the high value and the low value above zero volts. Example implementations of the circuit 100 in which the voltage signal generator 104 generates an oscillating voltage, Vosc, are described below with reference to FIGS. 6A-8.

II. Capacitance Measurement Using a Step Voltage

Figure 2A:
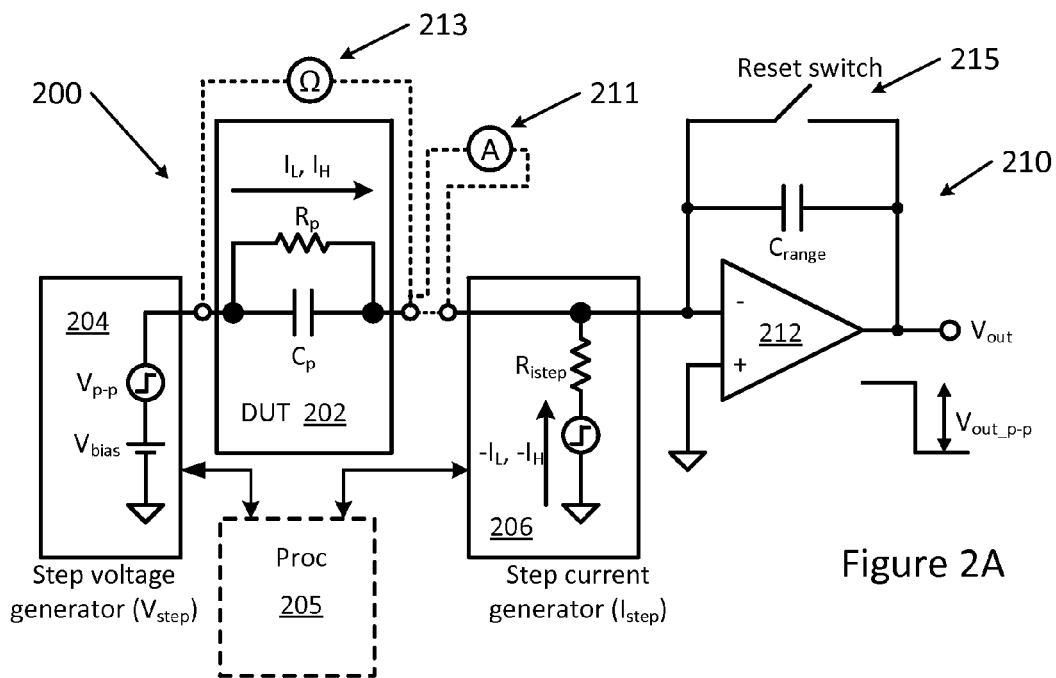
FIG. 2A is a schematic diagram of another example of a circuit for measuring capacitance in a DUT using a voltage signal generator that generates a step voltage signal.
Figure 2B:
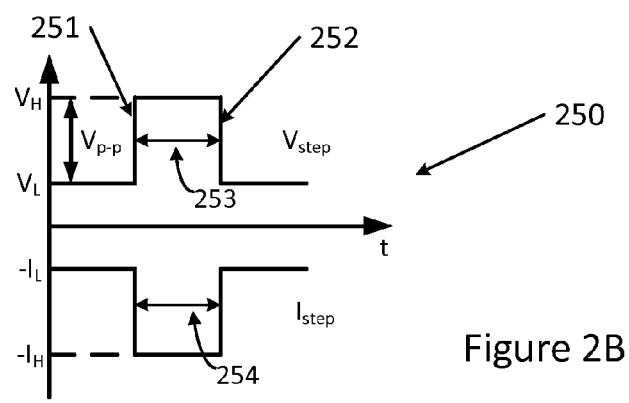
FIG. 2B is a graph illustrating example signal diagrams for a step voltage signal, $V_{step}$, and a step current cancellation signal, $I_{step}$, from the example circuit in FIG. 2A.

FIG. 2A is a schematic diagram of another example of a circuit for measuring capacitance 200 in a DUT 202 using a voltage signal generator 204 that generates a step voltage signal. The circuit 200 comprises connections to the DUT 202 as described above with reference to FIG. 1. The step voltage generator 204 generates a step voltage, $V_{step}$, having a rising edge 251 and a falling edge 252. FIG. 2B is a graph illustrating example signal diagrams for a step voltage signal, $V_{step}$, and a step cancellation current signal, $I_{step}$, from the example circuit in FIG. 2A. As shown in FIG. 2B, $V_{step}=V_{p-p}+V_{bias}$, and $V_{p-p}=V_H-V_L$, where $V_H$ is the high voltage value and $V_L$ is the low voltage value between which the step voltage signal alternates.

The circuit 200 includes a current signal generator 206 that generates a step cancellation current signal, $I_{step}$, alternating between a high current, $I_H$, and a low current, $I_L$, as the cancellation current signal. As shown in FIG. 2B, $I_{step}=-I_H--I_L$, where $I_H$ is the absolute value of the high current value and $I_L$ is the absolute value of the low current value between which the step current signal alternates. FIG. 2B illustrates the cancellation current signal, $I_{step}$, as having a negative value to indicate it flows in a direction opposite that of the current generated by the step voltage signal, $V_{step}$, through the DUT 202. The opposite flow of the currents where $I_{step}$ has the same magnitude as the leakage current results in the cancellation of the leakage current leaving the capacitance measurement current remaining.

The circuit 200 in FIG. 2A includes a signal measurement circuit 210 implemented as a charge-to-voltage ("Q-V") converter. The Q-V converter in FIG. 2A is an integrator that includes an integrating amplifier 212 and an integrating capacitor, $C_{range}$, which stores the capacitance measurement current as a charge from the DUT capacitance, $C_p$. The integrating capacitor, $C_{range}$, is connected as a feedback path for the amplifier 212 as is known in the art for integrators. Integration is performed over time, which may be marked by triggering a reset signal 215 on and off to time the integration. It is noted that the reset switch 215 may be implemented using any suitable switch including hardware on-off switches and software controlled digital outputs suitably configured to turn on or off the integration. The amplifier 212 of the integrator generates the voltage indicative of a charge as the output voltage.

The circuit 200 in FIG. 2A also includes an optional processor component 205, which may be used to control the step voltage signal generator 204 and the step current generator 206. The processor component 205 may be any suitable processing component such as a microprocessor, a microcomputer, a field-programmable gate array ("FPGA"), or any component capable of executing logic-based instructions. The processor component 205 may be equipped to receive signals as feedback to use in executing the instructions. Such signals may be used to generate commands to the voltage signal generator 204, the current signal generator 206, or both to modify their operation in response to the signal received. For example, the processor component 205 may be in signal communication with the voltage signal generator 204 to receive the voltage signal and with the current signal generator 206 to receive the cancellation current signal. Referring to FIG. 2B, the processor component 205 may be programmed to measure a voltage signal period 253 and a cancellation current signal period 254. If there is a difference greater than some predefined threshold between the voltage signal period 253 and the cancellation current signal period 254, the cancellation of the leakage current may not result in the cancellation of a sufficient amount of the leakage current. The processor 205 may generate command signals to the voltage signal generator or the current signal generator to correct a difference between the voltage signal period 253 and the cancellation current period 254.

It is noted that the processor component 205 is optional as example implementations may advantageously preclude the need for a processor. For example, in one implementation that resolves potential differences in the voltage signal period 253 and the cancellation current signal 254, a reference DUT may be used to obtain a measure of the voltage signal period 253 and an estimate of the time difference between the periods in advance of testing an individual DUT. The voltage signal used to obtain measurements from DUTs may use an adjusted voltage signal period 253 based on the estimated time difference thereby correcting the difference in advance. Other alternatives or other solutions that do not require a processor may be understood by those of ordinary skill in the art.

In an example implementation, the current signal generator 206 may be implemented using a cancellation voltage source, $V_{istep}$, and a resistor, $R_{istep}$, having a value that would allow the voltage source to generate the cancellation current signal with the levels $I_H$ and $I_L$ matching the leakage current levels, $I_H$ and $I_L$. The resistor, $R_{istep}$, may be a variable resistor that may be adjusted as the voltage source, $V_{istep}$, generates the voltage having the peak-to-peak and period characteristics of the step voltage signal, $V_{step}$. The processor component 205 is optional in this implementation and may be used to adjust the value of the voltage source, $V_{istep}$.

In another implementation, the processor component 205 may include or may communicate with a data storage component comprising a device characteristics record. The device characteristics record may include device characteristics of the DUT 202, which may further include leakage current characteristics. A function may be performed in which:

the device characteristics record is retrieved from the data storage component; and the processor uses the leakage current characteristics to calculate values for the cancellation current signal according to leakage current characteristics of the DUT.

In an example implementation, the circuit 200 may optionally include a current meter 211 as shown in FIG. 2A configured to measure the leakage current directly. The leakage current may be measured by generating a DC voltage at the DUT 202 and by measuring the current through the resistor, $R_p$. The processor component 205 may retrieve the leakage current reading from the current meter 211 and adjust the current signal generator 206 to generate the measured current. The circuit 200 may then be controlled to perform a capacitance measurement while the current signal generator 206 generates the measured leakage current.

In an example implementation, the circuit 200 may optionally include a resistance meter (or ohmmeter) 213 as shown in FIG. 2A configured to measure the resistance of resistor $R_p$ directly. The resistance $R_p$ may be measured by generating a DC voltage at the DUT 202 and by measuring the resistance, $R_p$. The processor component 205 may retrieve the value of the resistance, $R_p$, reading from the ohmmeter 213 and adjust the current signal generator 206 to generate the cancellation current signal based on the known value of resistance, $R_p$. For example, the resistance, $R_p$, may be used to determine the cancellation current values as follows:

$I_H = (\frac{1}{2} * V_{p\text{-}p} + V_{bias})/R_p$; and $I_L = (-\frac{1}{2} * V_{p\text{-}p} + V_{bias})/R_p$, where:

$V_{p\text{-}p} = V_H - V_L$, and $V_{bias} = (V_H + V_L)/2$.

Figure 3A:
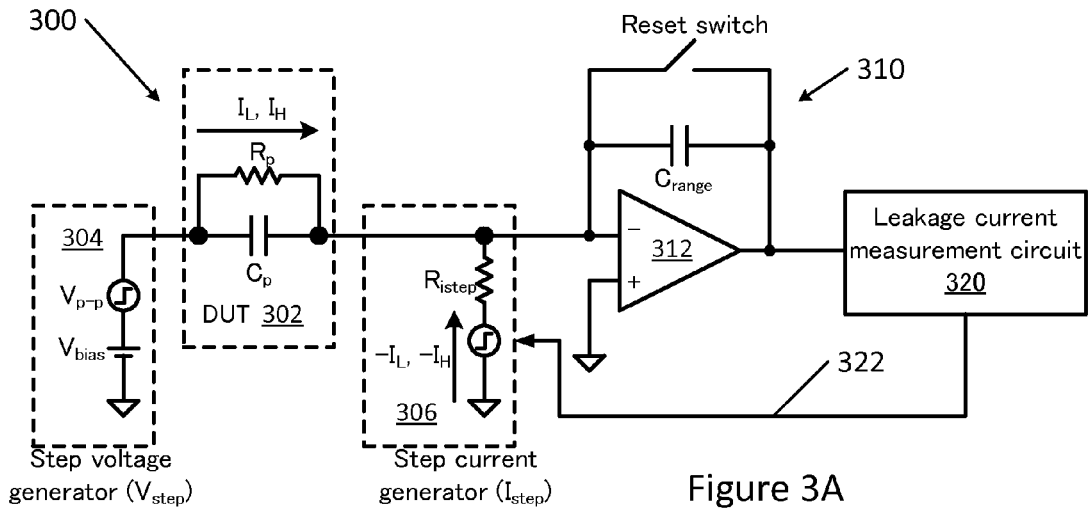
FIG. 3A is a schematic diagram of another example circuit for measuring capacitance in a DUT in which a step voltage signal is used.

FIG. 3A is a schematic diagram of another example circuit for measuring capacitance 300 in a DUT 302 in which a step voltage signal is used. The example in FIG. 3A includes a voltage signal generator 304, a current signal generator 306, and a signal measurement circuit 310 similar to the voltage signal generator 304, the current signal generator 306, and signal measurement circuit 310 in the circuit 200 described above with reference to FIG. 2A. The circuit 300 in FIG. 3A also includes a leakage current measurement circuit 320 configured to receive an output voltage of the signal measurement circuit 310. The leakage current measurement circuit 320 monitors the output voltage of the signal measurement circuit 310 to determine values for the current cancellation signal, $I_{step}$. The leakage current measurement circuit 320 provides the values for the cancellation current signal to the current signal generator 306 via a communication line 322.

The leakage current measurement circuit 320 may include programmed components operating as software to convert the received output voltages to current values. The leakage current measurement circuit 320 may include a processor, or a processor may be included in the circuit 300 in a manner similar to use of the processor component 205 in implementations consistent with the circuit 200 described with reference to FIG. 2A.

Figure 3B:
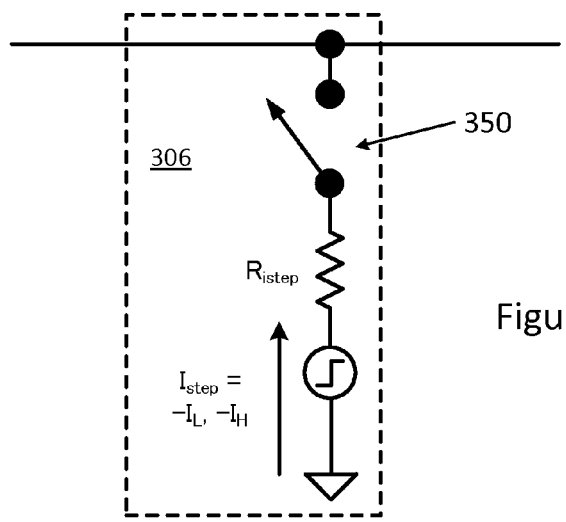
FIG. 3B is a schematic diagram of a cut-off switch for turning of current cancellation in the example circuit in FIG. 3A.

It is noted that leakage current cancellation may not be desired during a capacitance measurement. In such situations, a switch may be disposed to switch in, or out, the current signal generator 306. FIG. 3B is a schematic diagram of a cut-off switch 350 for turning off current cancellation in the example circuit in FIG. 3A. The circuit 300 may include the cutoff switch 350 in signal communication with the current signal generator 306 and an input to the signal measurement circuit 310 to selectively enable or disable leakage cancellation.

Referring back to FIG. 3A, the processor, which may be either the processor in the leakage current measurement circuit 320 or an added processor as described above, may control other aspects of the operation of the circuit 300 in FIG. 3A. For example, the signal measurement circuit 310 includes an integrator comprising an amplifier 312 and an integrating capacitor with capacitance $C_{range}$. The integrator may further include a reset switch 315 to trigger a measurement period that may be different than the measurement period defined by the step voltage, $V_{step}$.

In an example implementation of the circuit 300 in FIG. 3A, capacitance measurements may be performed using current cancellation via the current cancellation signal ($I_H$ and $I_L$) determined by any of the methods described above with reference to FIG. 2A. During operation, however, it may not be possible to cancel all of the leakage current. For example, as a capacitance measurement is performed for a step voltage signal, the integration would end on the downward edge of the step voltage (at 252 in FIG. 2B). However, if the output voltage of the signal measurement circuit 310 varies with time after the end of the integration, the variation is due to leakage current that was not cancelled by the cancellation current signal. This residual leakage current, $I_{residual}$, may be at a high enough level to affect the capacitance measurement. The residual leakage current, $I_{residual}$, may be determined by using a measurement period, $t_{leakage}$, which may be greater than the period of the step voltage signal, $V_{step}$, and measuring the change in the output voltage, $V_{leakage}$, of the signal measurement circuit 310 after the measurement. The following may then be used to calculate $I_{residual}$:

$I_{residual} = (C_{range} * V_{leakage})/t_{leakage}$.

The residual current value, $I_{residual}$, may then be compared to threshold values of $I_{residual}$ that would not affect the capacitance measurement. There are two levels of current for the cancellation current signal in the example shown in FIG. 3A: $I_H$ and $I_L$. Accordingly, there would be two levels of residual current for the cancellation current signal: $I_{Hresidual}$ and $I_{Lresidual}$. A threshold value of residual leakage current may be defined for each level of residual current. In an example implementation, a program controlled function may be implemented in which the measured residual current levels, $I_{Hresidual}$ and $I_{Lresidual}$, may be received and analyzed against thresholds. If the measured residual current levels, $I_{Hresidual}$ and $I_{Lresidual}$, are within a range of residual current levels that would affect capacitance measurements, the cancellation current signal values, $I_H$ and $I_L$, are adjusted. The adjustment of the cancellation current signal values, $I_H$ and $I_L$, may be repeated until the measured residual current levels, $I_{Hresidual}$ and $I_{Lresidual}$, are not within a range of residual current levels that would affect capacitance measurements.

Figure 4:
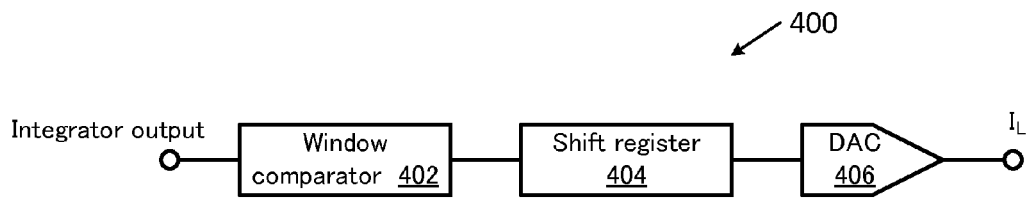
FIG. 4 is a schematic diagram of an example circuit for determining a current level to use as a cancellation current signal.

The voltage change, $V_{leakage}$, is indicative of the leakage current and may be used to generate values of $I_H$ and $I_L$ for the cancellation current signal, and to control the current signal generator 306 to generate the $I_H$ and $I_L$ values via the communication line 322. Values for $I_H$ and $I_L$ may be determined using any suitable search technique such as a binary search function according to the voltage change, $V_{leakage}$, or the residual current levels, $I_{Hresidual}$ and $I_{Lresidual}$. FIG. 4 illustrates a hardware-based way to determine the current values $I_H$ and $I_L$ base on the voltage change, $V_{leakage}$.

FIG. 4 is a schematic diagram of an example circuit 400 for determining a current level ($I_H$ or $I_L$) to use as a cancellation current signal. The circuit 400 in FIG. 4 includes a window comparator 402, a shift register 404, and a digital-to-analog converter ("DAC") 406. It is assumed for purposes of illustration that the circuit 400 is used under control of a processing component to determine current levels $I_H$ and $I_L$ for the circuit 300 in FIG. 3A. It is to be understood by those of ordinary skill in the art that the circuit 400 may also be used with other implementations of circuits for measuring capacitance.

Referring to FIG. 4, the window comparator 402 is in signal communication with the signal measurement circuit 310 to receive the output voltage. The window comparator 402 compares the received output voltage with two limits. The two limits are a top residual current limit, $+I_{Residual}$, and a bottom residual current limit, $-I_{Residual}$. The top residual current limit, $+I_{Residual}$, and the bottom residual current limit, $-I_{Residual}$, are values that represent the maximum increase in a residual current that can be tolerated before the residual current is so high it affects the capacitance measurement. The residual current is ideally 0, but actually either greater than or less than zero up to a threshold residual current when at an acceptable level. The + and – signs represent the direction of the current at the negative input of the amplifier 312 in the signal measurement circuit 310. The magnitude of the threshold residual current may be the same regardless of the direction of the current at the inverting input of the amplifier 312, or different depending on the requirements of specific implementations.

It is noted that the signal measurement circuit 310 generates an output voltage representing a current level. In the example in FIG. 4, the integrator output voltage is a voltage change after an integration measurement. This voltage change corresponds to the measured residual current for the values of $I_H$ and $I_L$ during the measurement. As described below, values of $I_H$ and $I_L$ may be determined by adjusting the values in a process of minimizing the residual current levels.

As shown in FIG. 4, the output voltage of the signal measurement circuit 310 is received at the window comparator 402, which compares the output voltage to a range of two output values representing the top residual current limit, $+I_{Residual}$, and the bottom residual current limit, $-I_{Residual}$. The window comparator 402 generates a first bit value indicative of an output voltage value in a range indicative of a leakage current value that would not influence the capacitance measurement and a second bit value indicative of the output voltage not in the range indicative of the leakage current value that would not influence the capacitance measurement. In the circuit in FIG. 4, the window comparator 402 generates a first bit value indicative of an output voltage representing a residual current that is within a range between the top residual current limit, $+I_{Residual}$, and the bottom residual current limit, $-I_{Residual}$. The window comparator 402 generates a second bit value indicative of an output voltage for a residual current that is outside the range between the top residual current limit, $+I_{Residual}$, and the bottom residual current limit, $-I_{Residual}$. If the bit value for the output voltage indicative of a residual current is within the range of $-I_{Residual}$ to $+I_{Residual}$, the residual current is within a range such that it would not influence the capacitance measurement. If the output voltage is outside the range of $-I_{Residual}$ to $+I_{Residual}$, the residual current level is too high.

The determination of whether or not the residual current is within an acceptable range is performed by collecting a time sequence of the bit values generated by the window comparator 402 and using a set of the sequence as a value indicative of whether or not the current levels $I_H$ and $I_L$ need to be adjusted. As shown in FIG. 4, the bit value output of the window comparator 402 is communicated to the shift register 404. The shift register receives the output having either the first bit value or the second bit value and stores the first or second bit value in an input bit location of the shift register 404 causing the bits stored in the shift register 404 to shift according to the operation of a typical shift register. The shift register 404 stores the stored bits as a shift register value representing a sequence of bit values received over time. The shift register 404 communicates the shift register value to the DAC 406, which converts the shift register value to an analog signal having a level indicative of the magnitude of the shift register value. This level of the analog signal is used to determine how much to adjust the cancellation current signal, $I_H$ and $I_L$, to further minimize the residual current. For example, if bit value 0 indicates that the measured residual current level is within the range of $-I_{Residual}$ to $+I_{Residual}$, bit value 1 indicates that the measured residual level is outside the range, and no signal inversions occur, the shift register value may be composed of all 1's during initial measurements. Accordingly, the analog signal level generated by the DAC 406 would be a correspondingly high signal level. After each measurement, the cancellation current signal levels, $I_H$ and $I_L$, are adjusted to reduce the residual current levels. After a number of measurements, the measured residual current level may be reduced to within the range of $-I_{Residual}$ to $+I_{Residual}$ and a first 0 bit value may be received. However, the residual current level may still be close to the threshold residual current level at which effect on the capacitance measurement is not significant. It may be desirable to further reduce the residual current to optimize current cancellation. After the first 0 bit value is reduced, the analog signal level magnitude level begins to decrease. As more 0 bit values are received, the analog signal level continues to decrease causing a decrease in the amount of adjustment to the cancellation current signal levels, $I_H$ and $I_L$. The process may be continued until a minimum value is detected. The minimum value may be detected when the analog signal levels begin to rise due to the receipt of 1 bit values indicating that the residual current level has again risen to a level beyond the range of $-I_{Residual}$ to $+I_{Residual}$. A processing component may be used to evaluate the shift register values corresponding to the cancellation signal values, $I_H$ and $I_L$, at each measurement to find the cancellation signal values, $I_H$ and $I_L$, that resulted in the minimum residual current level.

It is noted that one of ordinary skill in the art will understand that the example above is not limiting in the values selected to indicate the results of the window comparator 402 output, or how the analog signal is evaluated. The shift register 404 may be any suitable shift register having any desired number of bits. The DAC 406 may be of any word-width corresponding to that of the shift register 404.

Figure 5:
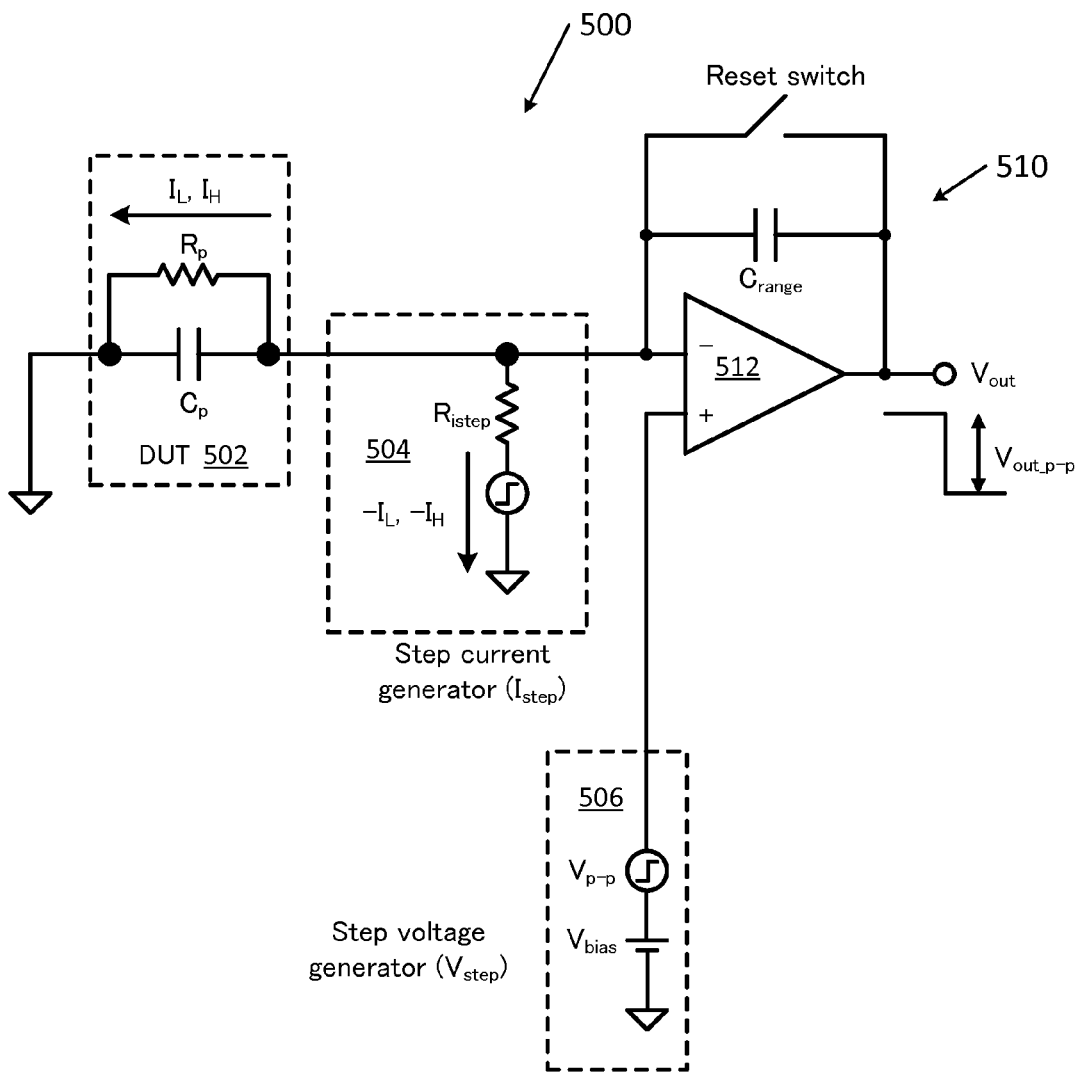
FIG. 5 is a schematic diagram of another example circuit for measuring capacitance in a DUT in which a step voltage signal is used.

FIG. 5 is a schematic diagram of another example circuit for measuring capacitance 500 in a DUT 502 in which a step voltage signal is used. The circuit 500 includes the first and second connectors to the DUT 502, a voltage signal generator 506, a current signal generator 504, and a signal measurement circuit 510. In the circuit 500 in FIG. 5, the first DUT connector of the DUT 502 is connected to ground. The signal measurement circuit 510 includes an inverting input connected to the second DUT connector and to the current signal generator 504. The signal measurement circuit 510 includes a non-inverting input connected to receive the voltage signal alternating between the high voltage and the low voltage from the voltage signal generator 506. The circuit 500 in FIG. 5 may be configured to perform capacitance measurements with leakage current cancellation performed with a cancellation current signal having a high current level, $I_H$, and a low current level, $I_L$, generated by the current signal generator 504. The circuit 500 may be implemented to use the various techniques described above for determining values for $I_H$ and $I_L$, and for fine-tuning the values on minimization of residual leakage current.

III. Capacitance Measurement Using an Oscillating Voltage

Figure 6A:
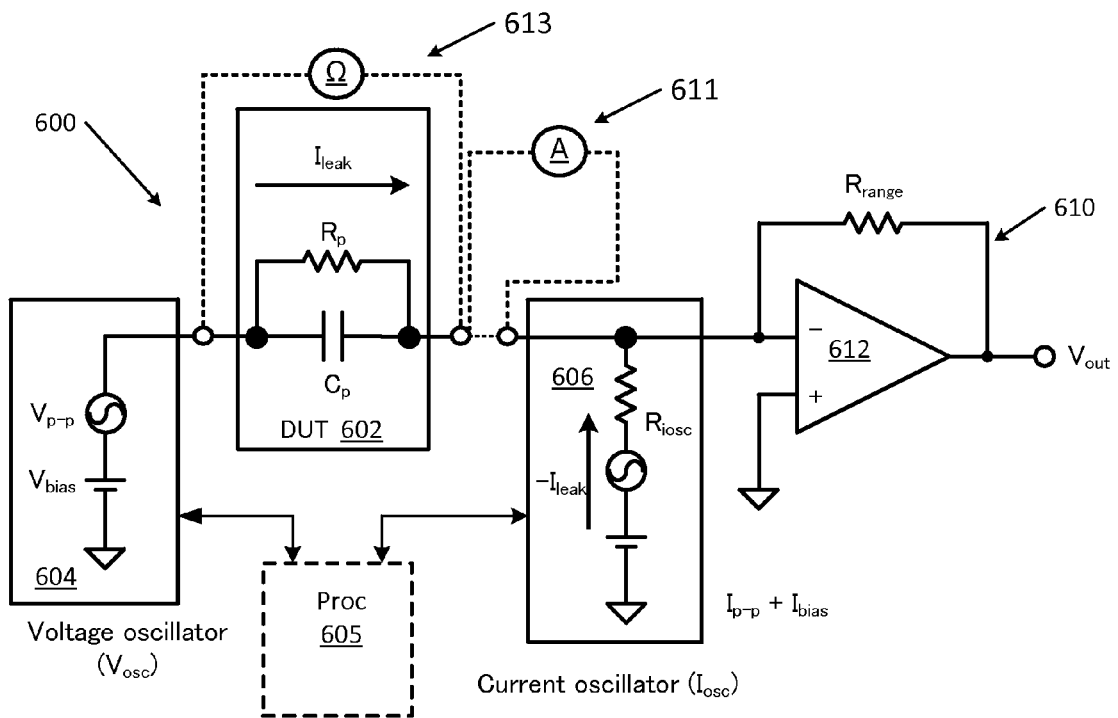
FIG. 6A is a schematic diagram of another example of a circuit for measuring capacitance in a DUT using a voltage generator that generates an oscillating voltage signal.
Figure 6B:
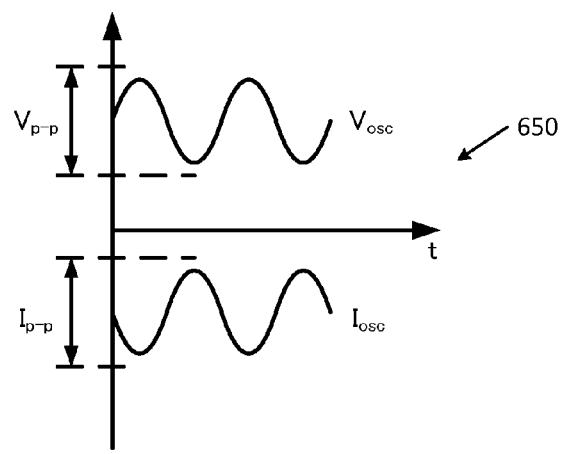
FIG. 6B is a graph illustrating example signal diagrams for an oscillating voltage signal, $V_{osc}$, and an oscillating current cancellation signal, $I_{osc}$, from the example circuit in FIG. 6A.

FIG. 6A is a schematic diagram of another example of a circuit for measuring capacitance 600 in a DUT 602 using an oscillating voltage generator 604 that generates an oscillating voltage signal. The oscillating voltage generator 604 generates an oscillating voltage, $V_{osc}$, having a sinusoidal shape. FIG. 6B is a graph illustrating example signal diagrams for an oscillating voltage signal, $V_{osc}$, and an oscillating cancellation current signal, $I_{osc}$, from the example circuit in FIG. 6A. As shown in FIG. 6B, $V_{osc}$ is a sinusoidal wave signal with voltage values that oscillate between a high peak to a low peak with a range of $V_{p-p}$. The oscillating voltage signal, $V_{osc}$ may also include a DC voltage bias, $V_{bias}$.

The circuit 600 includes a current signal generator 606 that generates an oscillating cancellation current signal, $I_{osc}$, alternating between a high current and a low current as the cancellation current signal. As shown in FIG. 6B, $I_{osc}$ is a sinusoidal current wave signal with current values that oscillate between a high peak to a low peak with a range of $I_{p-p}$. FIG. 6B illustrates the oscillating cancellation current signal, $I_{osc}$, as having a negative value to indicate it flows in a direction opposite that of the current generated by the oscillating voltage signal, $V_{osc}$, through the DUT 602.

The circuit 600 in FIG. 6A includes a signal measurement circuit 610 implemented as a current-to-voltage ("I-V") converter. The I-V converter in FIG. 6A includes an amplifier 612 and a feedback resistor, $R_{range}$. The amplifier 612 generates an output voltage signal, Vout, that indicates a current level at an inverting input of the amplifier 612

The circuit 600 in FIG. 6A also includes an optional processor 605, which may be used to control the oscillating voltage signal generator 604 and the oscillating current generator 606. The processor 605 may be any suitable processing component such as a microprocessor, a microcomputer, a field-programmable gate array ("FPGA"), or any component capable of executing logic-based instructions. The processor 605 may be equipped to receive signals as feedback to use in executing the instructions. Such signals may be used to generate commands to the voltage signal generator 604, the current signal generator 606, or both to modify their operation in response to the signal received. For example, the processor 605 may be in signal communication with the oscillating voltage signal generator 604 to receive the oscillating voltage signal and with the current signal generator 606 to receive the cancellation current signal. Referring to FIG. 6B, the processor 605 may be programmed to measure, or obtain a measurement through other hardware components of, a phase difference between the oscillating voltage signal, $V_{osc}$, and the oscillating cancellation current signal, $I_{osc}$. If the phase difference is greater than some predefined threshold, the cancellation of the leakage current may not result in the cancellation of a sufficient amount of the leakage current. The processor 605 may generate command signals to the voltage signal generator or the current signal generator to adjust the phase of one or the other to reduce the phase difference.

It is noted that the processor 605 is optional as example implementations may advantageously preclude the need for a processor. For example, in one implementation that resolves potential phase differences between the oscillating voltage signal and the oscillating cancellation current signal, a reference DUT may be used to obtain an estimate of the phase difference between the periods in advance of testing an individual DUT. The voltage signal used to obtain measurements from DUTs may use an adjusted voltage phase based on the estimated phase difference thereby correcting the difference in advance. Other alternatives or other solutions that do not require a processor may be understood by those of ordinary skill in the art.

In an example implementation, the current signal generator 604 may be implemented using voltage source, $V_{iosc}$, and a resistor, $R_{iosc}$, having a value that would allow the voltage source to generate the cancellation current signal with the levels $I_H$ and $I_L$ designed to match the leakage current levels, $I_H$ and $I_L$. The resistor, $R_{iosc}$, may be a variable resistor that may be adjusted as the oscillating voltage source, $V_{iosc}$, generates the voltage having the peak-to-peak and phase characteristics of the oscillating voltage signal, $V_{osc}$. The processor 605 is optional in this implementation and may be used to adjust the value of the voltage source, $V_{iosc}$.

In another implementation, the processor 605 may include or may communicate with a data storage component comprising a device characteristics record. The device characteristics record may include device characteristics of the DUT 602, which may further include leakage current characteristics. A function may be performed in which:

the device characteristics record is retrieved from the data storage component; and the processor uses the leakage current characteristics to calculate values for the cancellation current signal according to leakage current characteristics of the DUT.

In an example implementation, the circuit 600 may optionally include a current meter 611 as shown in FIG. 6A configured to measure the leakage current directly. The leakage current may be measured by generating a DC voltage at the DUT 602 and by measuring the current through the resistor, $R_p$. The processor 605 may retrieve the leakage current reading from the current meter 611 and adjust the current signal generator 606 to generate the measured current. The circuit 600 may then be controlled to perform a capacitance measurement while the current signal generator 606 generates the measured leakage current.

In an example implementation, the circuit 600 may optionally include a resistance meter (or ohmmeter) 613 as shown in FIG. 6A configured to measure the resistance of resistor $R_p$ directly. The resistance $R_p$ may be measured by generating a DC voltage at the DUT 602 and by measuring the resistance, $R_p$. The processor 605 may retrieve the value of the resistance, $R_p$, reading from the ohmmeter 613 and adjust the current signal generator 606 to generate the cancellation current signal based on the known value of resistance, $R_p$. For example, the resistance, $R_p$, may be used to determine the cancellation current values as follows:

$I_{osc} = V_{osc}/R_p$, where:

$V_{osc} = V_{p-p} + V_{bias}$, $V_{p-p}$=the peak-to-peak value of the oscillating voltage signal, and $V_{bias}$ is a DC bias voltage.

Figure 7:
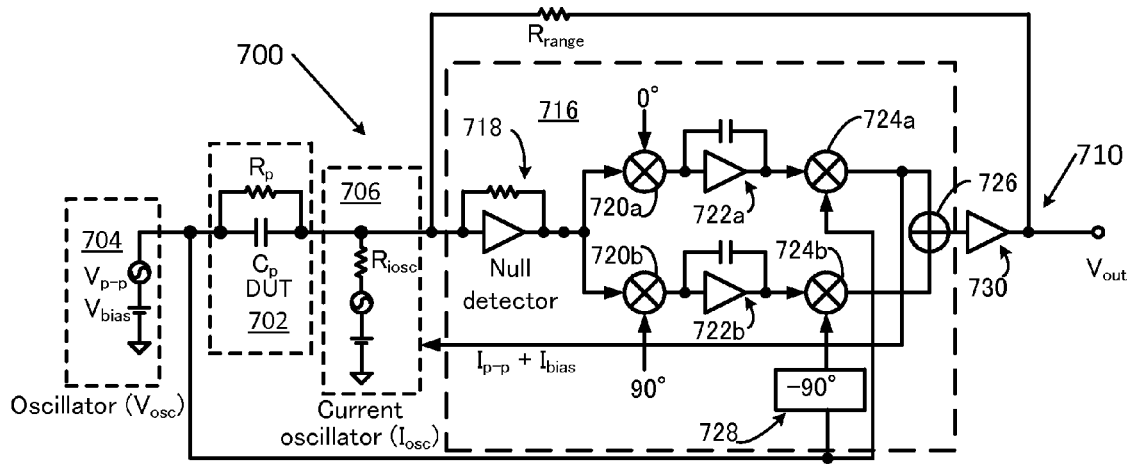
FIG. 7 is a schematic diagram of another example circuit for measuring capacitance in a DUT in which an oscillating voltage signal is used.

FIG. 7 is a schematic diagram of another example circuit 700 for measuring capacitance in a DUT 702 in which an oscillating voltage signal is used. The example in FIG. 6A includes a voltage signal generator 704, a current signal generator 706, and a signal measurement circuit 710 similar to the voltage signal generator 604, the current signal generator 606, and signal measurement circuit 610 in the circuit 600 described above with reference to FIG. 6A.

The circuit 700 in FIG. 7 also includes a real component detector 716 for detecting a real component in a signal from a capacitance measurement in which leakage current cancellation has been performed. The real component is that part of the signal that is due to leakage current. The real component detector 716 determines the extent to which the signal contains a real component and communicates a negative feedback intended to reduce the real component, preferably all the way to zero. The negative feedback includes revised values of the cancellation current signal ($I_{p-p}+I_{bias}$).

The real component detector 716 includes a null detector 718, which detects a zero voltage value at the node that receives the current from the DUT 702 and the current from the current signal generator 706. If the current from the current signal generator 706 is able to cancel all of the leakage current from the DUT 702, the real component of the voltage at the node should be zero. If a non-zero voltage is detected, the signal is split into a first signal and a second signal 90° out of phase with the first signal. The phase shift is the result of communicating the first signal to a 0° phase shifter 720a and the second signal to a 90° phase shifter 720b. The first and second signals are integrated by a first integrator 722a and a second integrator 722b. The result of the integration of the first signal is multiplied by the original $V_{osc}$ signal at first multiplier 724a. The result of the integration of the second signal is multiplied by the original $V_{osc}$ signal phase-shifted by −90° at a second multiplier 724b. The products of the first multiplier 724a and the second multiplier 724b are added to yield the real component of the signal at $V_{out}$ of an amplifier 730, which is part of the I-V converter operating as the signal measurement circuit 710.

As noted, the real component should be minimized in order to maximize the performance of the leakage current cancellation. The real component effectively represents the residual current that is has not been cancelled. The real component may be analyzed and used to generate values of $I_{p-p}$ (or $I_{osc}$) that would further minimize the real component to a level that would not influence the capacitance measurement.

Figure 8:
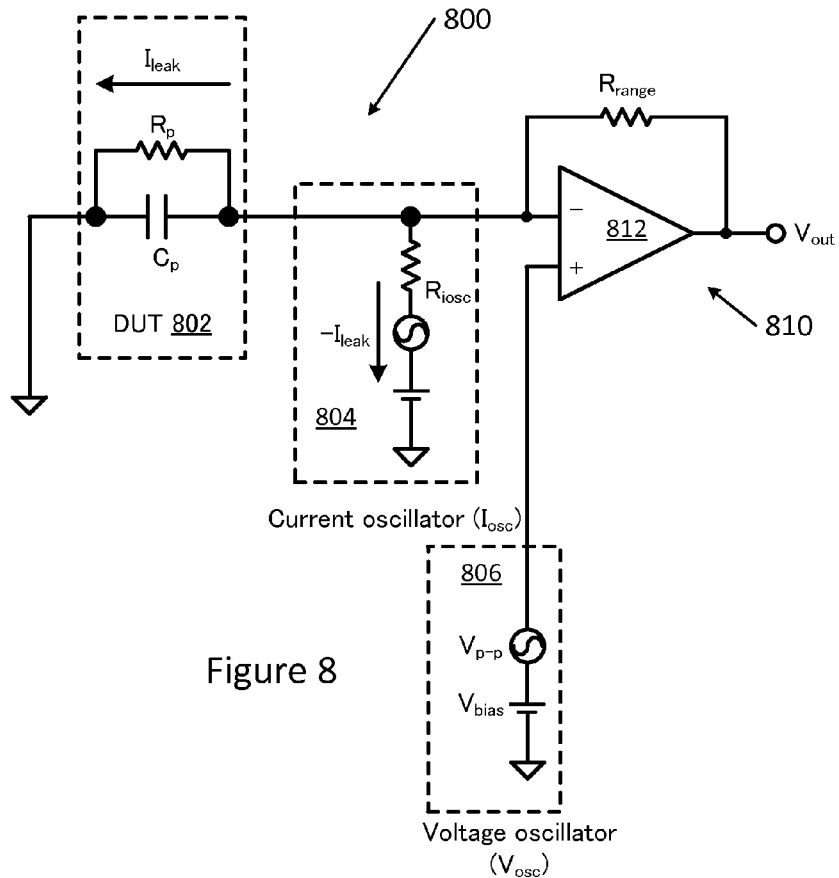
FIG. 8 is a schematic diagram of another example circuit for measuring capacitance in a DUT in which an oscillating voltage signal is used.

FIG. 8 is a schematic diagram of another example circuit 800 for measuring capacitance in a DUT 802 in which an oscillating voltage signal is used. The circuit 800 includes the first and second connectors to the DUT 802, a voltage signal generator 806, a current signal generator 804, and a signal measurement circuit 810. In the circuit 800 in FIG. 8, the first DUT connector of the DUT 802 is connected to ground. The signal measurement circuit 810 includes an inverting input connected to the second DUT connector and to the current signal generator 804. The signal measurement circuit 810 includes a non-inverting input connected to receive the oscillating voltage signal alternating between the high voltage and the low voltage from the voltage signal generator 806. The circuit 800 in FIG. 8 may be configured to perform capacitance measurements with leakage current cancellation performed with an oscillating cancellation current signal generated by the current signal generator 804. The circuit 800 may be implemented to use the various techniques described above for determining values for $I_{osc}$, and for fine-tuning the values on minimization of the real component of the voltage output representing the capacitance measurement.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A circuit for determining a capacitance on a device-under-test ("DUT") comprising:
    a voltage signal generator that generates a voltage signal alternating between a high voltage and a low voltage at regular time intervals, where the voltage signal generator is disposed in the circuit so as to generate the voltage signal to cause a DUT current to flow in the DUT, the DUT current comprising a leakage current and a capacitance measurement current in response to the voltage signal;
    a current signal generator connected to receive the DUT current from the DUT, the current signal generator configured to generate a cancellation current signal alternating between high and low values at the regular time intervals of the voltage signal such that the cancellation current signal cancels the leakage current through the DUT; and
    a signal measurement circuit configured to receive the capacitance measurement current remaining after the leakage current is canceled to generate an output voltage having an output voltage value used to determine a capacitance, $C_p$, of the DUT.

2. The circuit of claim 1 where:
    the current signal generator is implemented using a current source.

3. The circuit of claim 1 where:
    a first connector to the DUT is connected to receive the voltage signal alternating between the high voltage and the low voltage from the voltage signal generator;
    the signal measurement circuit includes an inverting input connected to a second connector to the DUT and to the current signal generator; and
    the signal measurement circuit includes a non-inverting input connected to ground.

4. A method for measuring capacitance on a device-under-test ("DUT"), the method comprising:

generating a voltage signal alternating between a high voltage and a low voltage to cause a DUT current to flow, the DUT current comprising a capacitance measurement current and a leakage current; and generating a cancellation current signal at a measurement node connected to receive the capacitance measurement current and the leakage current, the measurement node connected to an input of a signal measurement circuit to measure a current level from the measurement node, the cancellation current signal alternating between a high current level and a low current level being generated at a high cancellation current level and a low cancellation current level in a direction that substantially cancels the leakage current at the measurement node.

5. The method of claim 4 further comprising:

retrieving a device characteristics record comprising device characteristics of the DUT including leakage current characteristics from a data storage component; and calculating values for the cancellation current signal according to leakage current characteristics of the DUT.

\* \* \* \* \*